(12) United States Patent
Baur et al.

(10) Patent No.: US 7,196,359 B2
(45) Date of Patent: Mar. 27, 2007

(54) RADIATION-EMITTING CHIP AND RADIATION-EMITTING COMPONENT

(75) Inventors: Johannes Baur, Laaber (DE); Dominik Eisert, Regensburg (DE); Volker Harle, Waldetzenberg (DE)

(73) Assignee: Osram Opto Semiconductors GmbH, Rengensburg (DE)

( * ) Notice: Subject to any disclaimer, the term of this patent is extended or adjusted under 35 U.S.C. 154(b) by 262 days.

(21) Appl. No.: 10/486,953

(22) PCT Filed: Jun. 5, 2002

(86) PCT No.: PCT/DE02/02047

§ 371 (c)(1),
(2), (4) Date: Aug. 23, 2004

(87) PCT Pub. No.: WO03/017385

PCT Pub. Date: Feb. 27, 2003

(65) Prior Publication Data

US 2004/0262625 A1    Dec. 30, 2004

(30) Foreign Application Priority Data

Aug. 13, 2001 (DE) ................. 101 39 723

(51) Int. Cl.
    *H01L 33/00* (2006.01)
(52) U.S. Cl. ............ 257/99; 257/98; 257/81; 257/434; 257/678; 257/680
(58) Field of Classification Search .......... None
    See application file for complete search history.

(56) References Cited

U.S. PATENT DOCUMENTS

| 5,705,834 | A | * | 1/1998 | Egalon et al. ............. 257/95 |
| 5,864,171 | A | | 1/1999 | Yamamoto et al. |
| 5,929,465 | A | | 7/1999 | Nee et al. |
| 6,229,160 | B1 | | 5/2001 | Krames et al. |
| 6,858,881 | B2 | | 2/2005 | Eisert et al. |
| 2003/0173575 | A1 | | 9/2003 | Eisert et al. |

FOREIGN PATENT DOCUMENTS

DE    24 16 098    10/1975

(Continued)

OTHER PUBLICATIONS

Song Jae Lee et al.: "Efficiency improvement in light-emitting diodes based on geometrically deformed chips", SPIE vol. 3621, (Jan. 1999) pp. 237-248.

(Continued)

*Primary Examiner*—Leonardo Andujar
*Assistant Examiner*—Tan Tran
(74) *Attorney, Agent, or Firm*—Cohen Pontani Lieberman & Pavane LLC

(57) ABSTRACT

A radiation-emitting chip (2) with a radiation-transmissive window (5), which has a refractive index $n_F$ and has a main area (19), with a multilayer structure (9), which contains a radiation-active layer (10) and adjoins the main area (19) of the window (5), and with a radiation-transmissive medium surrounding the window (5) and having the refractive index $n_O$, the window (5) having at least two boundary areas (6, 7), which form an angle β, for which the relationship $$90°-\alpha_t < \beta < 2\alpha_t \text{ where } \alpha_t = \arcsin(n_O/n_F)$$

is satisfied. A radiation-emitting component contains a chip (2) of this type.

24 Claims, 6 Drawing Sheets

FOREIGN PATENT DOCUMENTS

| | | |
|---|---|---|
| DE | 198 07 758 A1 | 12/1998 |
| DE | 199 45 919 A1 | 3/2000 |
| DE | 100 06 738 A1 | 9/2001 |
| EP | 0 405 757 A | 1/1991 |
| EP | 0 961 328 A | 12/1999 |
| JP | 59 004008 A | 4/1984 |
| JP | 8-288577 | 11/1996 |
| JP | 10 326910 A | 12/1998 |
| KR | 00245192 B1 | 11/1999 |
| WO | WO 02/03477 A1 | 1/2002 |
| WO | WO 02 073705 A | 9/2002 |

OTHER PUBLICATIONS

E. Yablonovitch et al., "Van der Waals bonding of GaAs epitaxial liftoff films onto arbitrary substrates", Applied Physics Lett. 56 (24), Jun. 11, 1990, pp. 2419-2421.

Bhargava, Ramesh N., "Blue and UV Light Emitting Diodes and Lasers", Optoelectronics—Devices and Technologies, vol. 7, No. 1, pp. 19-47, Jun. 1992.

* cited by examiner

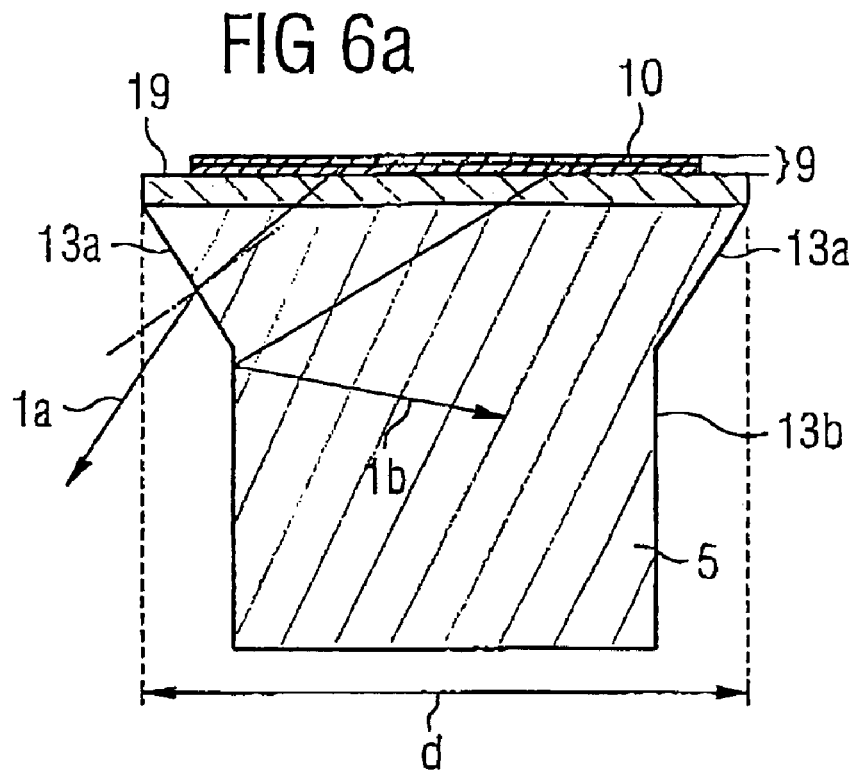
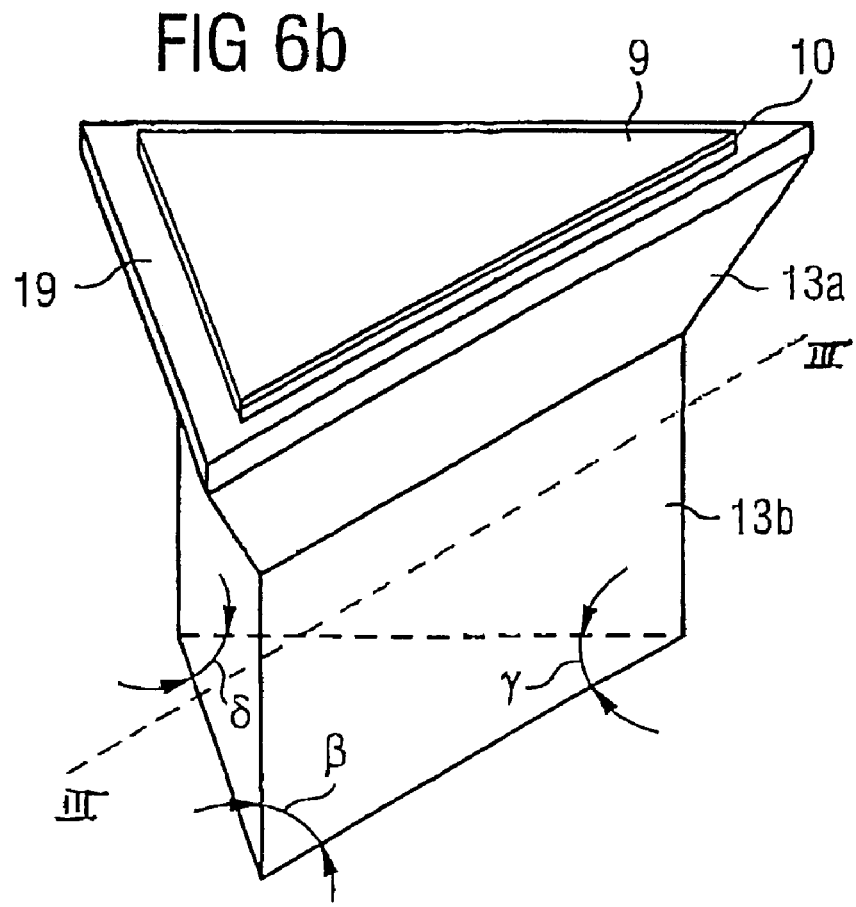

RADIATION-EMITTING CHIP AND RADIATION-EMITTING COMPONENT

RELATED APPLICATIONS

This is a U.S. national stage of application No. PCT/DE/02047, filed on 5 Jun. 2002.

This patent application claims the priority of German patent application number 101 39 723.2, the disclosure content of which is hereby incorporated by reference.

FIELD OF THE INVENTION

The invention relates to a radiation-emitting chip with a radiation-transmissive window, which has a refractive index $n_F$ and a main area, and with a multilayer structure, which contains a radiation-generating active layer and is arranged at the main area of the window, the window being surrounded by a radiation-transmissive medium having a refractive index $n_0$, which is less than the refractive index $n_F$ of the window. The invention also relates to a radiation-emitting component which includes such a chip.

BACKGROUND OF THE INVENTION

A radiation-emitting chip of the type mentioned generally has a multilayer structure with an active radiation-generating layer, which is applied to a substrate. Radiation is coupled out at least partly through the substrate, the substrate being transparent to the radiation generated.

In this arrangement, the radiation efficiency is often greatly limited by total reflection at the substrate surface. This problem area occurs particularly in the case of substrates having a high refractive index, for example an SiC substrate, and a correspondingly small angle of total reflection.

This is especially the case with a substrate having a square or rectangular cross section, in which multiple successive total reflections limit the radiation efficiency. This is illustrated by way of example in FIG. 8, which shows a section through a radiation-transmissive substrate 20. If a radiation portion 1 propagating in the sectional plane impinges on an interface of the substrate 20, then it is at least partly coupled out if the angle $\theta_1$ of incidence is less than the angle $\alpha_t$ of total reflection. Here and below, angle of incidence and angle of total reflection relate to the normal to the interface.

If the angle $\theta_1$ of incidence is greater than the angle $\alpha_t$ of total reflection, as illustrated, only relevant radiation portion 1 is subjected to total reflection. The angle $\alpha_t$ of total reflection thus defines a so-called coupling-out cone 3, illustrated in the section by the dashed boundaries 4a, 4b, the aperture angle of which amounts to $2\alpha_t$. If the relevant radiation portion 1 impinges on the interface in such a way that it lies within the coupling-out cone 3, then it is at least partly coupled out, otherwise it is subjected to total reflection.

In the example illustrated the substrate 20 has a square cross section. The radiation portion 1 continuously impinges on the interfaces of the substrate 20 outside the coupling-out cone 3. Therefore, the radiation portion 1 circulates cyclically in the substrate 20 whilst undergoing multiple total reflection and is finally absorbed without being coupled out beforehand.

SUMMARY OF THE INVENTION

It is an object of the present invention to provide a radiation-emitting chip having improved coupling-out of radiation.

It is another object of the invention to provide a radiation-emitting component having an improved radiation efficiency.

These and other objects are attained in accordance with one aspect of the present invention directed to a radiation-emitting chip with a radiation-transmissive window having a refractive index $n_F$ and a main area and with a multilayer structure, which comprises a radiation-generating active layer and is arranged at the main area of the window, the window being surrounded by a radiation-transmissive medium having a refractive index $n_0$, which is less than the refractive index of the window $n_F$, and having at least two boundary areas, which form an angle $\beta$, for which the relationship $$90°-\alpha_t<\beta<2\alpha_t$$

is satisfied. This inequality is referred to below as coupling-out condition. In this case, $\alpha_t$ designates the angle of total reflection for the interface between window and surrounding medium and is given by $$\alpha_t=\arcsin(n_0/n_F).$$

This shaping of the window has the advantage that radiation portions which are subjected to total reflection at one of the two boundary areas forming the angle $\beta$ are coupled out at the corresponding other boundary area. Continuous multiple total reflections are thus reduced and the radiation efficiency is improved.

In an advantageous refinement of the invention, the window has coupling-out structures which are at least partly bounded by areas which form the angle $\beta$ mentioned. Such coupling-out structures may be, by way of example, pyramids or prisms which are formed from the window or are attached to the window by a plurality, the side areas of which are arranged in such a way that at least two respective side areas form an angle that satisfies the coupling-out condition.

In a preferred embodiment of the invention, the side opposite to the main area of the window is provided as mounting area of the chip. In this case, by way of example, the side area of the window may form an angle $\beta$ that satisfies the coupling-out condition. In this case, side areas are to be understood in particular as the window flanks, i.e. the boundary areas of the window which run from the main area to the opposite side of the window.

In this embodiment, particular preference is given to windows with a cross section parallel to the main area, referred to below as lateral cross section, which has the form of a triangle with the internal angles $\beta$, $\gamma$, and $\delta$, at least one of these angles satisfying the abovementioned coupling-out condition.

The radiation efficiency is advantageously increased further if two or even all three internal angles satisfy the coupling-out condition. Therefore, particular preference is given to windows having a lateral triangular cross section with internal angles $\beta$, $\gamma$ and $\delta$ for which the following hold true:

$$90°-\alpha_t<\beta<2\alpha_t$$

$$90°-\alpha_t<\gamma<2\alpha_t$$

$$90°-\alpha_t<\delta<2\alpha_t$$

Given such a cross section it is ensured for radiation portions which propagate in the cross-sectional plane that each radiation portion is at least partly coupled out after at most one total reflection upon impingement on the next interface of the window.

A preferred embodiment of the invention relates to the application of the coupling-out condition to windows which have a side area which, relative to the multilayer structure, runs obliquely or concavely or is stepped, so that the window, as seen from the multilayer structure, tapers with increasing distance from the multilayer structure. The oblique arrangement of the side area with respect to the multilayer structure reduces the angle of incidence for radiation generated within the active layer relative to the relevant side area and thus further increases the coupling-out.

In this case, particular preference is given to a shaping wherein the window has a side area which, relative to the multilayer structure, runs obliquely or concavely or is stepped and, as seen from the multilayer structure, has arranged downstream of it a side area running perpendicularly to the multilayer structure, which latter side area in particular adjoins the former side area.

In this case, the side area arranged perpendicularly to the multilayer structure facilitates the fabrication and mounting of the window, while the oblique side area primarily increases the radiation efficiency. More widely, it is possible for this purpose to roughen side areas of the window, in particular side areas arranged obliquely with respect to the multilayer structure.

Given this shaping, that side of the window which is opposite to the mounting area and is preferably parallel to the main area may serve as mounting area of the chip, with which side the radiation-emitting chip can be soldered or adhesively bonded into a corresponding housing.

In the case of this form, two side areas of the window base preferably form an angle which satisfies the coupling-out condition. In this case, the window base is to be understood as that region of the window which is bounded by the side areas arranged perpendicularly to the multilayer structure. In this case, particular preference is again given to a shaping wherein the window base has a lateral cross section in the form of a triangle, at least one internal angle of the triangle satisfying the coupling-out condition. A prism form in which as many internal angles as possible satisfy the coupling-out condition is generally advantageous for the window base.

Preferably, in the case of the invention, the multilayer structure is fabricated epitaxially and the window is produced from a substrate used for the epitaxy. The outlay required for fabricating the chip is advantageously kept low as a result, since the window simultaneously serves as epitaxial substrate.

In an advantageous development of the invention, the materials for the window and the multilayer structure, in particular the active layer contained therein, are chosen in such a way that the refractive index of the window is greater than the refractive index of the multilayer structure or the active layer contained therein. The transition from the multilayer structure to the window then represents a transition to an optically denser medium, so that total reflection of the radiation generated within the multilayer structure does not occur at the interface between multilayer structure and window.

A particularly preferred embodiment of the invention relates to GaN-based radiation-emitting semiconductor chips. In these semiconductor chips, the multilayer structure, in particular the active layer, contains GaN, AlGaN, InGaN or InAlGaN. In this case, the active layer may also be embodied as a layer sequence, for example in the form of a quantum well structure. Multilayer structures of this type are generally fabricated epitaxially, in particular SiC substrates or sapphire substrates being suitable as epitaxial substrate.

The window is preferably produced from the epitaxial substrates used. In order to satisfy the coupling-out conditions, in the case of an SiC substrate having a refractive index of about 2.7, a partial encapsulation is necessary in the region of the boundary areas—forming the angle β—with a refractive index $n_0$ of greater than 1.35, since the coupling-out condition can only be satisfied for a refractive index ratio $n_F/n_0 < 2$. This will be explained in more detail below.

In particular, reaction resins, for example, epoxy resins, acrylic resins, silicone resins or a mixture of these resins, may serve as the encapsulation. In this case, epoxy resins are distinguished by high transparency and silicone resins are distinguished by a particularly good radiation resistance, in particular in the blue-green, blue and ultraviolet spectral regions.

BRIEF DESCRIPTION OF THE DRAWINGS

FIG. 6a is a cross sectional view taken along line III—III of the perspective view shown in FIG. 6b of a sixth exemplary embodiment of a radiation-emitting chip according to the invention.

DETAILED DESCRIPTION OF THE DRAWINGS

Identical or identically acting elements are provided with the same reference symbols in the figures.

Figure 1A:
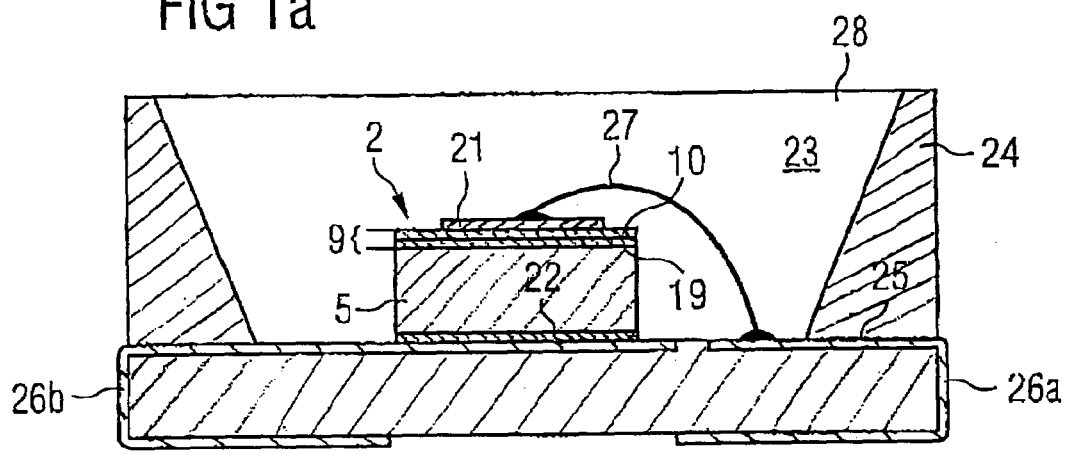
FIG. 1a is a cross-sectional view taken along line I—I of the of the plan view shown in FIG. 1b of an exemplary embodiment of a component according to the invention, FIGS. 2a and 2b respectively show a partial cross sectional view of a first and a second exemplary embodiment of a radiation-emitting chip according to the invention.
Figure 1B:
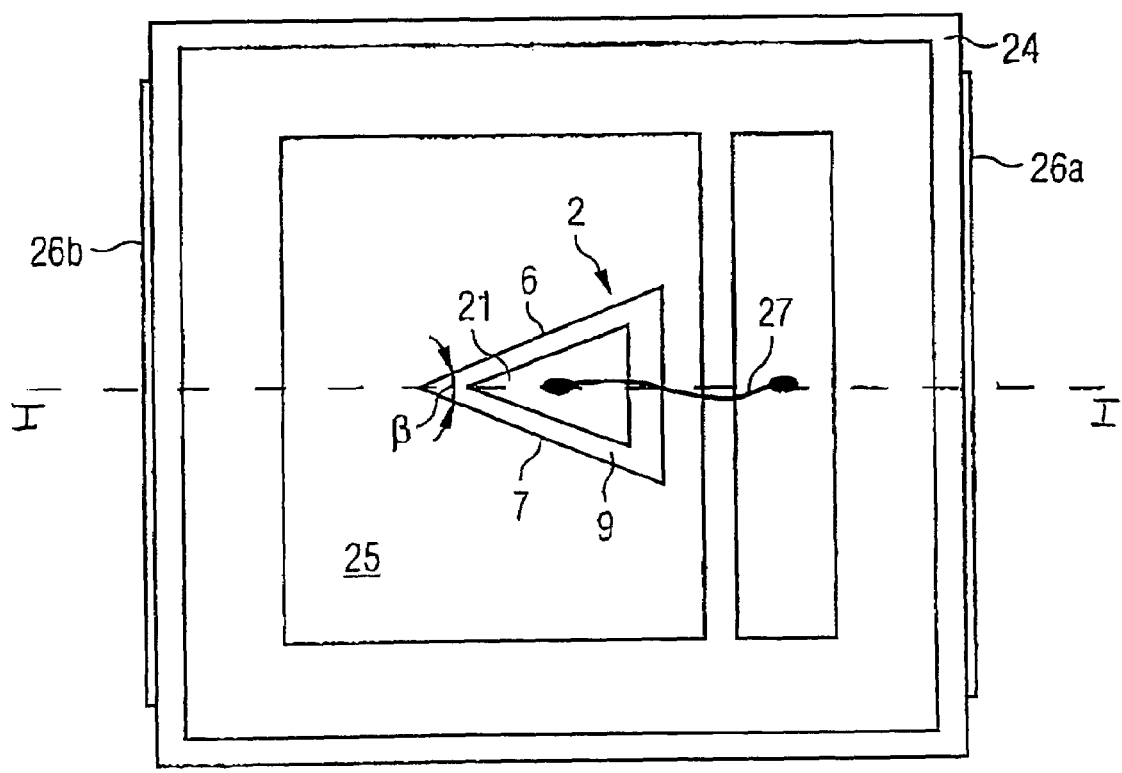

The component which is illustrated in section in FIG. 1a and in plan view in FIG. 1b comprises a radiation-emitting chip 2 arranged in a recess 23 of a housing basic body 24. The side walls of the recess are beveled and serve as a reflector for the radiation generated by the chip 2.

The radiation-emitting chip 2 has a window 5 with a main area 19, on which a multilayer structure 9 is arranged. The sectional plane of the view shown in FIG. 1a is perpendicular to the main area 19.

A radiation-generating active layer 10 is formed within the multilayer structure 9. On the side which is remote from the window 5, the multilayer structure 9 is provided with an upper contact area 21; the window is provided with a lower contact area 22 on the side opposite to the main area 19.

A leadframe 25 is embedded in the housing basic body, leadframe terminals 26a, 26b being led out laterally from the housing basic body 24. The chip 2 is mounted onto a chip terminal region of the leadframe 25 by the lower contact area 22. The chip 2 may for example be soldered on or adhesively bonded on by means of an electrically conductive adhesive. From the upper contact area 21, a wire connection 27 is led to a wire terminal region of the leadframe.

The recess 23 in the housing basic body is filled with a radiation-transmissive molding composition 28 encapsulating the chip 2. This may for example be a potting based on a reaction resin. In particular, epoxy resins, acrylic resins, silicone resins or mixtures of these resins are suitable for this.

Furthermore, the molding composition 28 encapsulating the chip 2 may contain luminescent materials which convert part of the radiation generated by the chip into radiation having a different wavelength. The radiation generated by the component may bring about the optical impression of polychromatic or in particular white light, for example, on account of additive color mixing. Examples of suitable luminescent materials are luminescent materials having the general formula $A_3B_5X_{12}$:M where $A_3B_5X_{12}$ denotes a host crystal and M denotes a luminescent center incorporated therein, preferably an atom or ion from the group of rare earths, such as Ce, for example. The compounds YAG:Ce ($Y_3Al_5O_{12}$:Ce), TAG:Ce ($Tb_3Al_5O_{12}$:Ce), TbYAG:Ce (($Tb_xY_{1-x})_3Al_5O_{12}$:Ce, $0 \leq x \leq 1$), GdYAG:Ce (($Gd_xY_{1-x})_3Al_5O_{12}$:$Ce^{3+}$, $0 \leq x \leq 1$) and GdTbYAG:Ce (($Gd_xTb_yY_{1-x-y})_3Al_5O_{12}$:$Ce^3$, $0 \leq x \leq 1$, $0 \leq y \leq 1$) and mixtures based thereon have proved to be efficient luminescent materials. In this case, Al may be replaced at least in part by Ga or In.

The window 5 of the chip 2 may be produced for example from an SiC substrate on which the multilayer structure 9 is grown in the form of a GaN-based semiconductor layer sequence.

The chip 2 has a lateral cross section in the form of a triangle. In this case, two side areas 6, 7 of the window form an internal angle $\beta$ of the triangle, which satisfies the coupling-out condition.

Figure 2A:
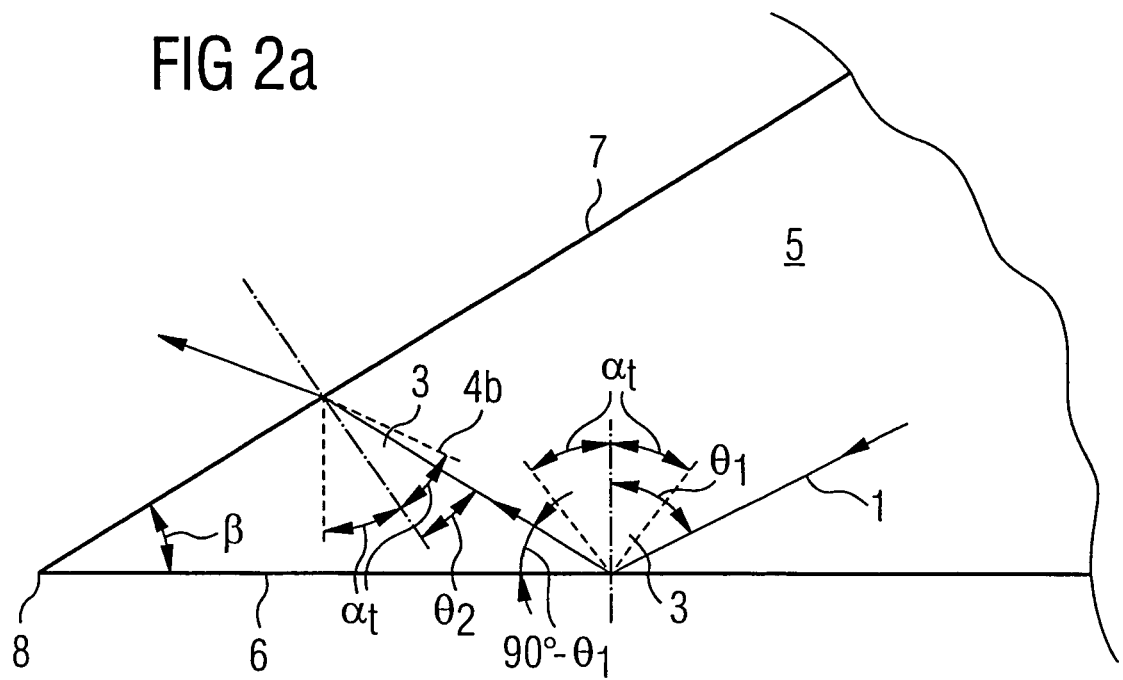
Figure 2B:
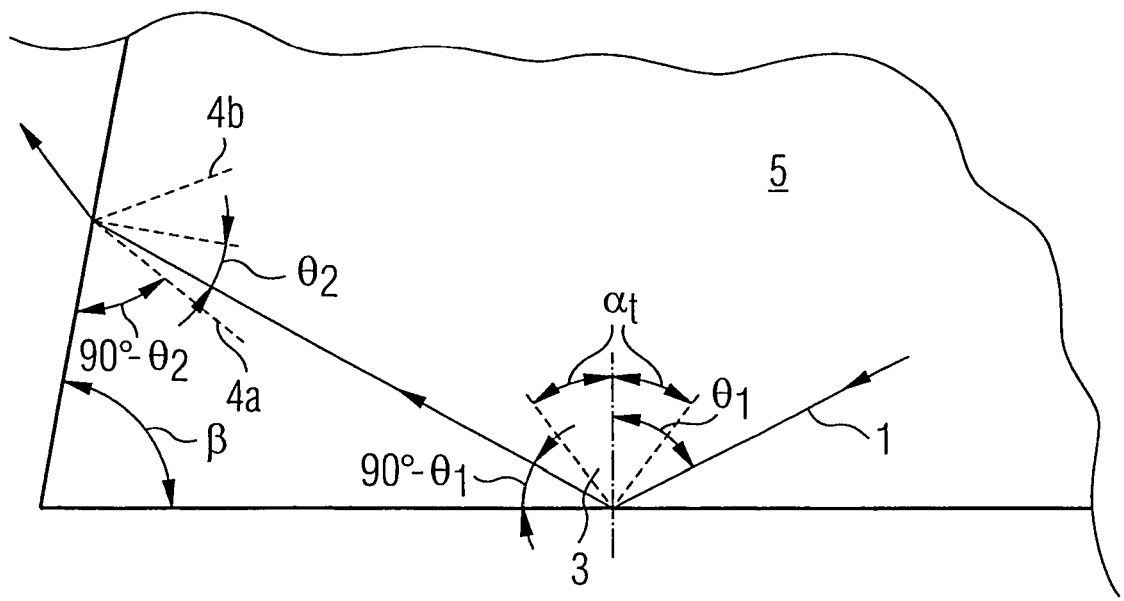

The coupling-out condition is explained in more detail below with reference to FIGS. 2a and 2b. FIGS. 2a and 2b in each case show a partial sectional view of a window 5 of a radiation-emitting chip according to the invention. The window 5 has a first boundary area 6 and a secondary boundary area 7, which are perpendicular to the sectional plane and form an angle $\beta$ which satisfies the coupling-out condition. It is thereby ensured that—without restricting the generality—after a total reflection at the first boundary area 6, the radiation is at least partly coupled out at the second boundary area 7 or is not subjected to total reflection a second time.

In this respect, the ray 1 shall be considered in FIG. 2a, which ray impinges on the first boundary area 6 at an angle $\theta_1$ of incidence, is subjected to total reflection there and is then incident on the boundary area 7 at an angle $\theta_2$. In order that the ray 1 is not subjected to total reflection a second time at the second boundary area, the angle $\theta_2$ of incidence must be less than the angle $\alpha_t$ of total reflection or the ray must impinge within the coupling-out cone 3.

Thus, the angle $\beta$ must on the one hand be chosen to be large enough that, as illustrated in FIG. 2a, the ray 1 impinges on the interface 7 with respect to the boundary 4b—which is on the right-hand side in FIG. 2a—within the coupling-out cone 3, where the following holds true:

$$\theta_2 < \alpha_t \quad (1)$$

On the other hand, $\beta$ must be chosen to be small enough that, as illustrated in FIG. 2b, the ray 1 also impinges on the interface with respect to the boundary 4a—which is on the left-hand side in FIG. 2b—of the coupling-out cone 3, where the following again holds true:

$$\theta_2 < \alpha_t \quad (2)$$

In the first case illustrated in FIG. 2a, the following results for the relationship of $\beta$, $\theta_0$ and $\theta_2$ $$\theta_2 = \theta_1 - \beta \quad (3)$$

so that there follows from (1)

$$\beta > \theta_1 - \alpha_t \quad (4)$$

Since the ray 1 is subjected to total reflection at the boundary area 6, $\theta_1$ lies between 90° and $\alpha_t$. Condition (4) is thus satisfied for all possible angles $\theta_1$ if the following holds true:

$$\beta > 90° - \alpha_t \quad (5)$$

For the second case illustrated in FIG. 2b the following relationship holds true between $\theta_1$, $\theta_2$ and $\beta$:

$$\theta_2 = \beta - \theta_1 \quad (6)$$

There thus follows from (2)

$$\beta < \alpha_t + \theta_2 \quad (7)$$

The angle $\theta_1$ again lies between $\alpha_t$ and 90° on account of the first total reflection at the interface 6, so that (7) is satisfied for all possible angles $\theta_1$ if the following holds true:

$$\beta < 2\alpha_t \quad (8)$$

The combination of the lower limit for $\beta$ as given by (5) and the upper limit for $\beta$ as given by (8) results in the coupling-out condition $$90° - \alpha_t < \beta < 2\alpha_t \quad (9)$$

In this case, for a window 5 having the refractive index $n_F$ and an adjoining medium having a refractive index $n_0$, which is less than $n_F$, the angle $\alpha_t$ of total reflection is given by $$\alpha_t = \arcsin(n_0/n_F). \quad (10)$$

In order to satisfy the coupling-out condition, $\alpha_t$ must be greater than 30°. Otherwise, the lower limit for $\beta$ would be greater than 60° and the upper limit for $\beta$ would be less than 60°, so that the two inequalities of the coupling-out condition are not simultaneously satisfied by any value for $\beta$.

Accordingly, the refractive index ratio $n_0/n_F$, in accordance with equation (10), must be greater than 0.5. This accords with the fact that the refractive index $n_F$ of the window is permitted to be at most twice as large as the refractive index of the adjoining medium $n_0$. Otherwise, the coupling-out condition cannot be satisfied.

For highly refractive materials such as, for example, SiC having a refractive index of about $n_0 = 2.7$, this can be achieved by means of a medium surrounding the radiation-emitting chip in the form of a corresponding encapsulation, for example a potting composition having a refractive index $n_0 > 1.35$. By way of example, for a potting composition having a typical refractive index of $n_0 = 1.5$, the angle $\alpha_t$ of total reflection has a value of about 34°. From the coupling-out condition (9), a range $$56° < \beta < 68°$$

thus results for $\beta$.

Figure 3:
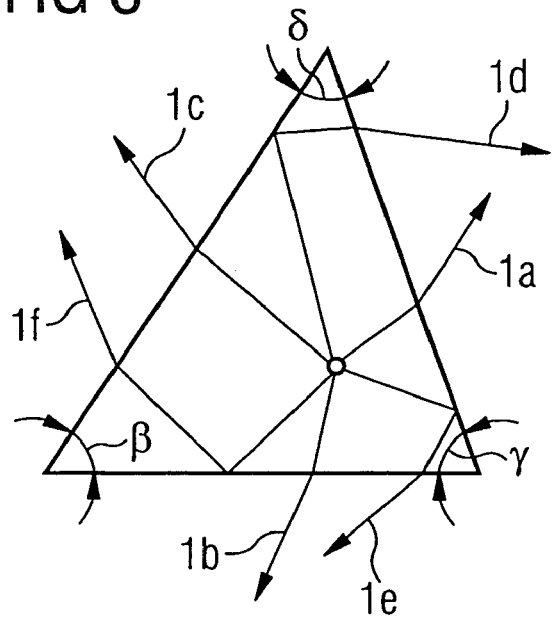
FIG. 3 shows a cross sectional view of a third exemplary embodiment of a radiation-emitting chip according to the invention.

FIG. 3 illustrates the lateral cross section of a particularly advantageous window form of a chip according to the invention.

Figure 8:
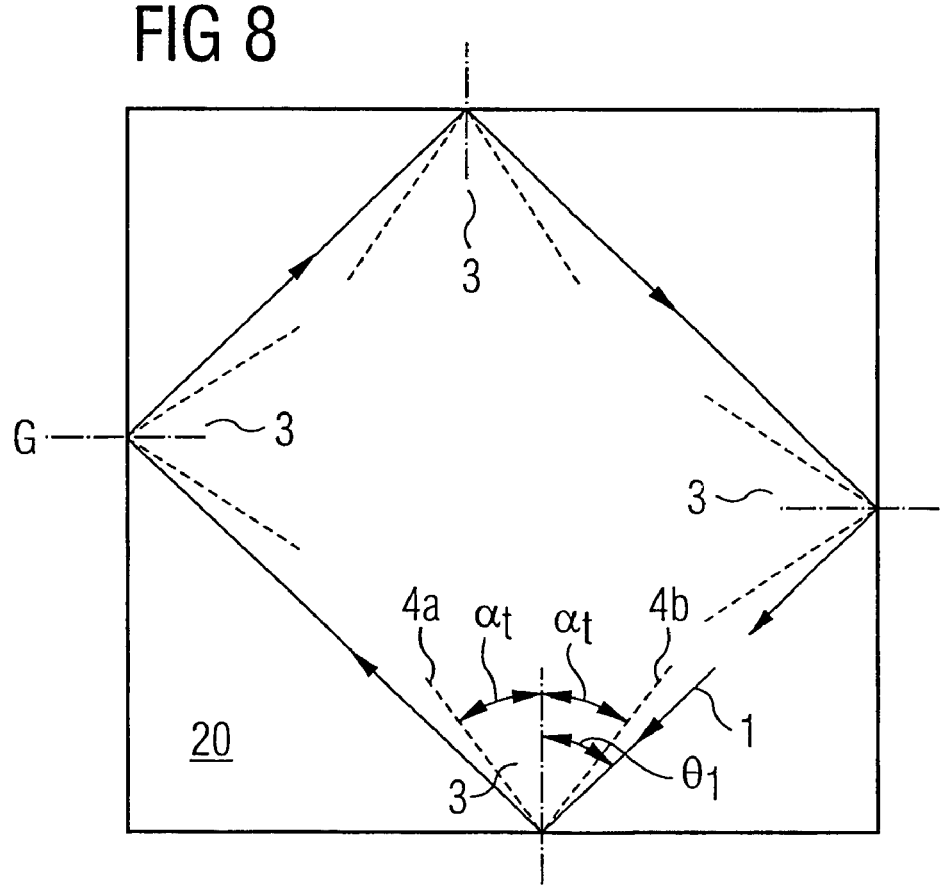
FIG. 8 shows a cross sectional view of a radiation-emitting chip according to the prior art.

The cross section has the form of a triangle, the coupling-out condition being satisfied for all three internal angles $\beta$, γ and δ. For the abovementioned example of an SiC window having a refractive index $n_F=2.7$ and a potting having a refractive index $n_O=1.5$, this would be the case in particular also for an equilateral triangle ($\beta=\gamma=\delta=60°$). In a highly advantageous manner, each ray running within the cross-sectional plane is either coupled out directly after impinging on a side area, cf. rays 1a, 1b, 1c or is subjected to total reflection once at most, cf. rays 1d, 1e, 1f. A continued circulation whilst undergoing multiple total reflection, as is illustrated in FIG. 8, for example, cannot occur.

Figure 4:
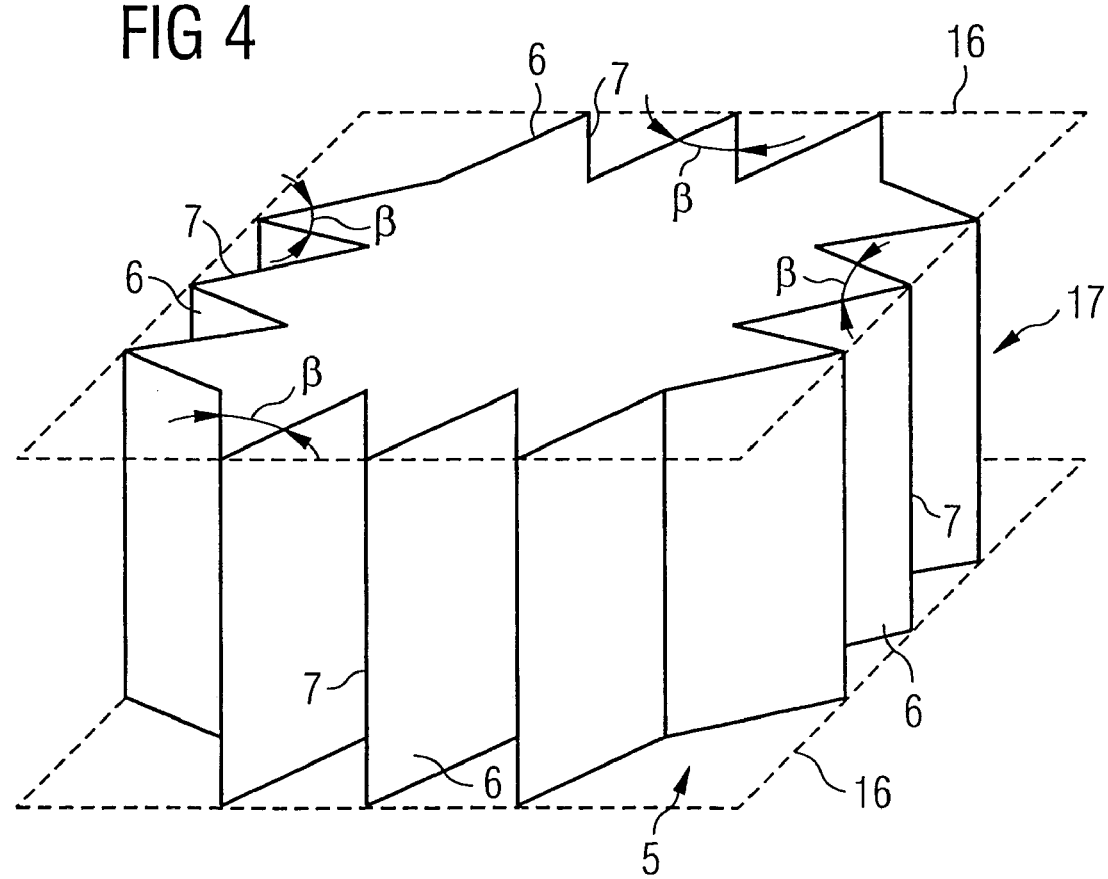
FIG. 4 shows a diagrammatic perspective illustration of a fourth exemplary embodiment of a radiation-emitting chip according to the invention.

FIG. 4 perspectively illustrates a window 5 of a further exemplary embodiment of a radiation-emitting chip according to the invention. In contrast to the exemplary embodiment described previously, the lateral cross section has a square envelope 16. The window is peripherally provided with a serrated coupling-out structure 17, the outer edges of which are formed by in each case two areas 6, 7, which form an angle β which satisfies the coupling-out condition. When fabricating such a window, it is advantageously possible to use a conventional window with a square cross section which is provided with the serrated coupling-out structure 17 shown through removal of the corresponding regions, for example by cutting with a saw or etching.

Figure 5A:
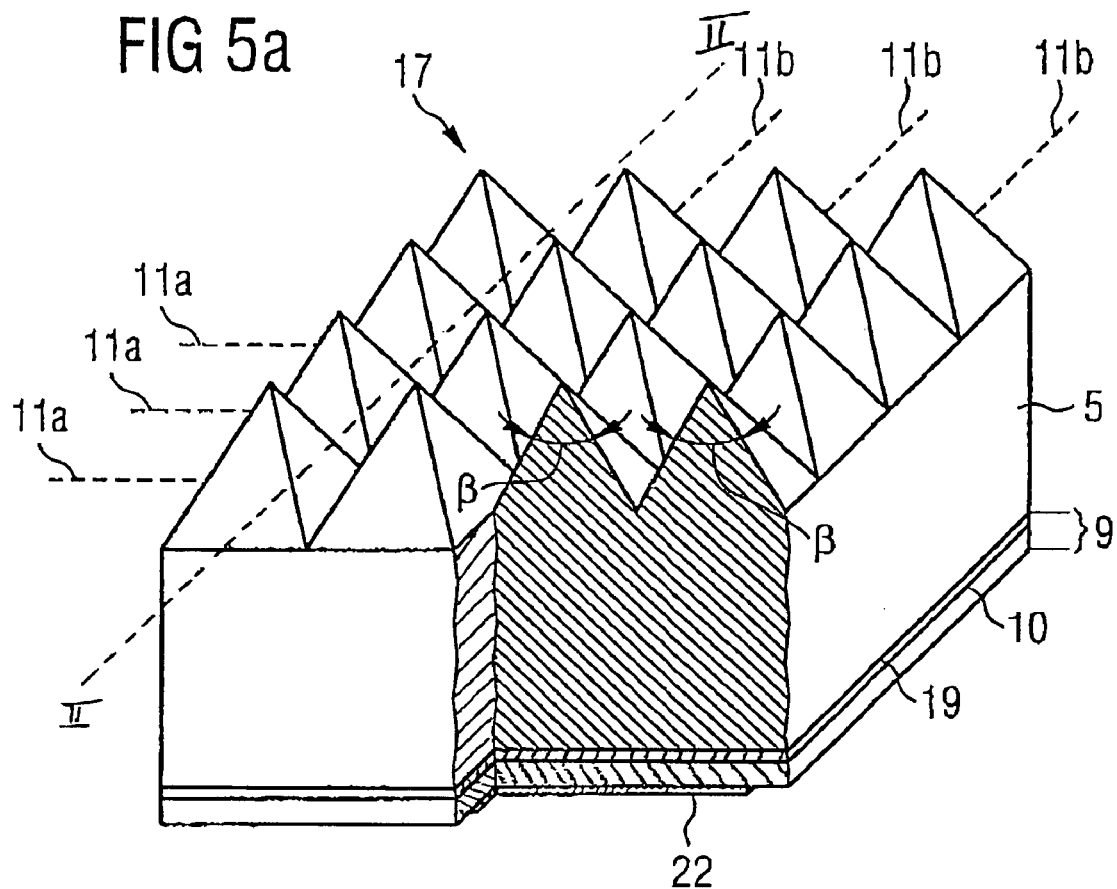
FIG. 5a shows a diagrammatic perspective illustration of a fifth exemplary embodiment of a radiation-emitting chip according to the invention.

FIG. 5a perspectively illustrates a further exemplary embodiment of a radiation-emitting chip according to the invention. Here a multilayer structure 9 with a radiation-active layer 10 is applied to a window 5, so that the multilayer structure 9 adjoins a main area 19 of the window 5. Parallel to said main area, the window has a square lateral cross section and, on the side opposite to the main area, is provided with a coupling-out structure 17 composed of a plurality of pyramids. In this case, the angle β between two mutually opposite pyramid side areas is chosen such that it satisfies the coupling-out condition.

That side of the multilayer structure 9 which is remote from the window 5 is provided with a contact area 22, via which the operating current is impressed into the radiation-active layer during operation. The contact area 22 simultaneously serves as a mounting side of the chip. By way of example, the chip may be fixed on a chip mounting area of a suitable housing by said contact area, as already described. A further contact area (not illustrated) may be provided at the side areas of the window, for example, provided that the window is electrically conductive.

Figure 5B:
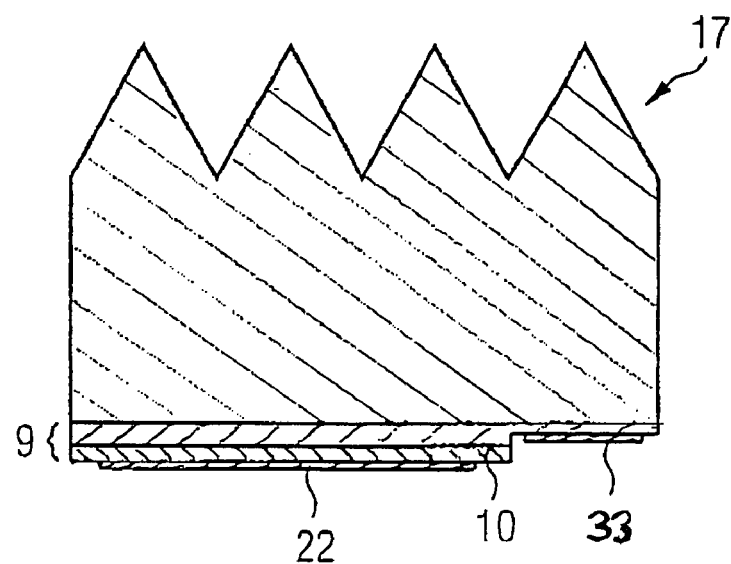
FIG. 5b is a cross sectional view taken along line II—II of FIG. 5a, but with a modification.

FIG. 5b illustrates a modification of the exemplary embodiment in section. Here two contact areas 22 and 33 are arranged on that side of the multilayer structure 9 which is remote from the window 5. A part of the multilayer structure 9 including the active layer 10 is removed and —contact area 33—is arranged on that part of the multilayer structure 9 which remains at the removal location. The other contact area 22 is applied, as in the case of the chip shown in FIG. 5a, on the main area of the multilayer structure 9 opposite to the window 5.

In this arrangement, that region of the multilayer structure 9 which lies between window 5 and active layer 10 is connected to the contact area 33, so that an operating current impressed via the contact areas 22 and 33 flows through the active layer 10.

In this exemplary embodiment, as in the previous exemplary embodiment as well, when fabricating the window it is advantageously possible to proceed from a conventional, cube-like or parallelepipedal window structure, so that existing fabrication methods and apparatuses can continue to be used in part. The coupling-out pyramids may be fabricated for example by etching or cutting with a saw. In the latter case, a V-shaped forming saw blade is used for this purpose and the window is cut by sawing multiply in parallel fashion along the mutually orthogonal sawing lines 11a and 11b on the side opposite to the multilayer structure 9.

FIG. 6a illustrates a diagrammatic sectional illustration and FIG. 6b an associated perspective illustration of a particularly preferred exemplary embodiment of a radiation-emitting chip according to the invention. Like the exemplary embodiment described previously, the chip has a multilayer structure 9 which comprises a radiation-active layer 10 and adjoins a main area 19 of a window 5. The sectional plane of the sectional illustration shown in FIG. 6a is perpendicular to the multilayer structure or the main area of the window 5.

In contrast to the previous exemplary embodiments, the window has side areas 13a which run obliquely with respect to the multilayer structure 9 and in each case merge with side areas 13b arranged perpendicularly to the multilayer structure. Such a window form may be fabricated for example by the window 5 being introduced by sawing from that side which is remote from the multilayer structure 9 using a suitable forming saw blade.

By virtue of the inclination of the side areas 13a, the angle of incidence is reduced for the radiation 1a impinging there and the proportion of coupled-out radiation is correspondingly increased.

By contrast, radiation portions 1b, which impinge on the side areas 13b arranged perpendicularly to the multilayer structure, that is to say in the region of the window base, are more easily subjected to total reflection, so that the coupling-out of radiation is lower in the region of the window base than in the region of the inclined window side areas 13a.

In this case, it is advantageous to form the window base in such a way that at least two of its boundary areas, preferably two side areas, form an angle β which satisfies the coupling-out condition. A window base in the form of a triangular prism is particularly advantageous in this case, cf. FIG. 6b, preferably two or even all three of the internal angles β, γ, and δ are of the lateral triangular cross section of the window base satisfying the coupling-out condition.

Although, in the exemplary embodiment shown, the coupling-out condition does not always ensure that only a maximum of one total reflection occurs, since the radiation does not propagate exclusively parallel to the main plane of the window or the multilayer structure 9, cf. ray 1b, a continuous total reflection that impedes the coupling-out is nevertheless prevented for a part of said radiation and the degree of coupling-out is increased overall.

Figure 7:
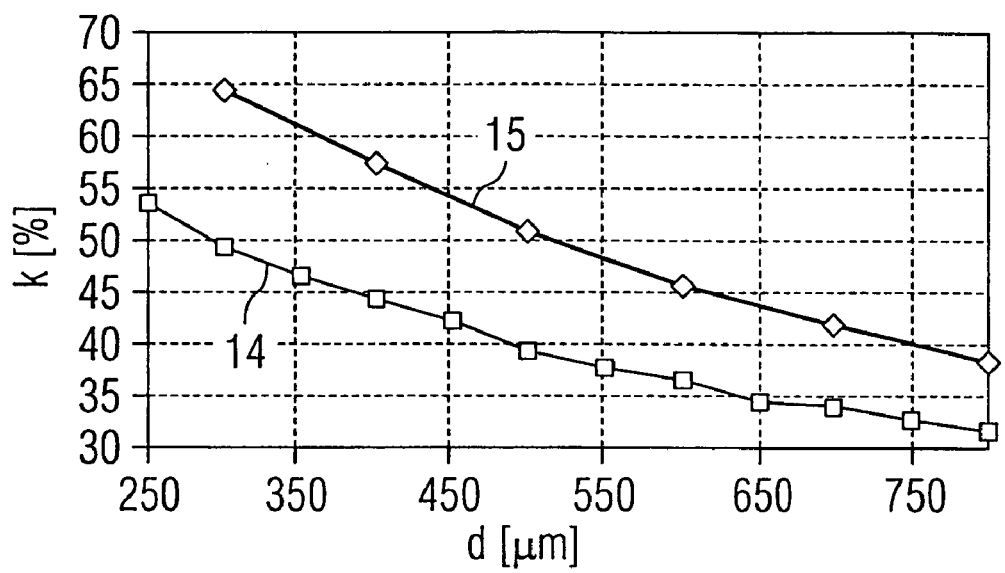
FIG. 7 shows a graph of the degree of coupling-out of a seventh exemplary embodiment of a radiation-emitting chip according to the invention in comparison with a radiation-emitting chip according to the prior art.

This is verified by the diagram illustrated in FIG. 7. The illustration shows the theoretically calculated degree of coupling-out k, i.e. the coupled-out radiation relative to the total radiation generated for a chip corresponding to FIG. 6a with different edge lengths d. The line 14 or the associated measurement points specify the degree of coupling-out for a window with a square cross section, as the line 15 and the associated measurement points specify the degree of coupling out for a window corresponding to the invention with a cross section in the form of an equilateral triangle. The degree of coupling-out was determined by means of a ray tracing program for an SiC substrate and an encapsulation having the refractive index $n_F=2.7$ and $n_O=1.55$, respectively. For these refractive indices, an angle of 60° lies in the angular range defined by the coupling-out condition, so that all three internal angles of an equilateral triangle satisfy the coupling-out condition.

An increase in the degree of coupling-out in the case of the invention is achieved for the entire edge length range illustrated and in part amounts to more than 25% (relative to the degree of coupling-out of the window with a square cross section). Consequently, the invention achieves a significant improvement in the coupling-out of radiation even for a window form corresponding to FIG. 6a.

It goes without saying that the explanation of the invention on the basis of the exemplary embodiments shown does not constitute a restriction of the invention thereto.

The invention claimed is:

1. A radiation-emitting chip (2) with a radiation-transmissive window (5), which has a refractive index $n_F$ and a main area (19), and with a multilayer structure (9), which contains a radiation-generating active layer (10) and is arranged at the main area (19) of the window (5), the window (5) being surrounded by a radiation-transmissive medium having a refractive index $n_0$, which is less than the refractive index $n_F$ of the window, characterized in that the window (5) is bounded toward the radiation-transmissive medium at least by two areas (6, 7), which form an angle β, for which the relationship $90° - \alpha_t < \beta < 2\alpha_t$ is satisfied, where $\alpha_t$ is given by $\alpha_t = \arcsin(n_0/n_F)$.

2. The radiation-emitting chip (2) as claimed in claim 1, characterized in that
the two areas (6, 7) are side areas of the window (5).

3. The radiation-emitting chip (2) as claimed in claim 1, characterized in that
the window (5), parallel to the main area (19), has a triangular cross section with the internal angles β, γ and δ.

4. The radiation-emitting chip (2) as claimed in claim 3, characterized in that
the relationship $90° - \alpha_t < \gamma < 2\alpha_t$ is satisfied for γ.

5. The radiation-emitting chip (2) as claimed in claim 4, characterized in that
the relationship $90° - \alpha_t < \delta < 2\alpha_t$ is satisfied for δ.

6. The radiation-emitting chip (2) as claimed in claim 1, characterized in that
the window (5) has at least one side area (13a), which, relative to the multilayer structure (9), runs obliquely or in curved fashion or is stepped in such a way that the window (5) tapers as seen from the multilayer structure (9).

7. The radiation-emitting chip (2) as claimed in claim 6, characterized in that
the window has a side area (13b) arranged perpendicular to the multilayer structure (9), which side area, as seen from the multilayer structure, is arranged downstream of the side area (13a) which runs obliquely or in curved fashion or is formed in stepped fashion, and in particular adjoins said side area.

8. The radiation-emitting chip (2) as claimed in claim 6, characterized in that
at least the side area (13a) which runs obliquely or concavely or is stepped is roughened.

9. The radiation-emitting chip (2) as claimed in claim 6, characterized in that
the window (5) has the form of a prism in the region of the side area (13b) running perpendicularly to the multilayer structure (9).

10. The radiation-emitting chip (2) as claimed in claim 1, characterized in that
the multilayer structure (9) is fabricated epitaxially and the window (5) is produced from a substrate used for the epitaxy.

11. The radiation-emitting chip (2) as claimed in claim 1, characterized in that
the refractive index $n_F$ of the window is greater than the refractive index of the multilayer structure (9), in particular of the active layer (10).

12. The radiation-emitting chip (2) as claimed in claim 1, characterized in that
that side of the window (5) which is opposite to the multilayer structure (9) is a mounting side of the chip (2).

13. The radiation-emitting chip (2) as claimed in claim 1, characterized in that
the multilayer structure is formed from semiconductor layers.

14. The radiation-emitting chip (2) as claimed in claim 13, characterized in that
the multilayer structure (9) contains at least one of the compounds GaN, AlGaN, InGaN or AlInGaN.

15. The radiation-emitting chip (2) as claimed in claim 1, characterized in that
the window (5) contains SiC.

16. The radiation-emitting chip (2) as claimed in claim 1, characterized in that
the window (5) contains sapphire.

17. The radiation-emitting chip (2) as claimed in claim 1, characterized in that
the medium surrounding the window (5) is a reaction resin.

18. The radiation-emitting chip (2) as claimed in claim 17, characterized in that
the reaction resin contains an epoxy resin, a silicone resin, an acrylic resin or a mixture of these resins.

19. A radiation-emitting component,
characterized in that
it contains a radiation-emitting chip (2) as claimed in claim 1.

20. The radiation-emitting component as claimed in claim 19,
characterized in that
it has a housing basic body (24), onto which the radiation-emitting chip (2) is mounted.

21. The radiation-emitting component as claimed in claim 20,
characterized in that
a recess (23) is formed in the housing basic bodywork (24), the radiation-emitting chip (2) is arranged in said recess.

22. The radiation-emitting component as claimed in claim 19,
characterized in that
the recess is filled with the medium surrounding the chip (2) or the window (5).

23. The radiation-emitting component as claimed in claim 22,
characterized in that
the recess is filled with a reaction resin.

24. The radiation-emitting component as claimed in claim 23,
characterized in that
the reaction resin contains an epoxy resin, a silicone resin, an acrylic resin or a mixture of these resins.

* * * * *

UNITED STATES PATENT AND TRADEMARK OFFICE
CERTIFICATE OF CORRECTION

PATENT NO. : 7,196,359 B2  Page 1 of 1
APPLICATION NO. : 10/486953
DATED : March 27, 2007
INVENTOR(S) : Johannes Baur It is certified that error appears in the above-identified patent and that said Letters Patent is hereby corrected as shown below:

Title page item (75), inventors: change the name "Volker Harle" to --Volker Härle.--

Title page item (73), assignee: change the city from "Rengensburg" to --Regensburg.--

Page 2 under references cited of item (56), change "JP59 004008" to --JP 59 004088.--

Signed and Sealed this

Twenty-second Day of December, 2009

David J. Kappos
*Director of the United States Patent and Trademark Office*